(12) United States Patent
Kwon et al.

(10) Patent No.: US 9,736,950 B2
(45) Date of Patent: Aug. 15, 2017

(54) DISPLAY DEVICE

(71) Applicant: LG DISPLAY CO., LTD., Seoul (KR)

(72) Inventors: DaeSung Kwon, Paju-si (KR);
HyeonYong Eom, Paju-si (KR);
Moonyoung Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/978,513

(22) Filed: Dec. 22, 2015

(65) Prior Publication Data

US 2017/0034928 A1 Feb. 2, 2017

(30) Foreign Application Priority Data

Jul. 29, 2015 (KR) .................. 10-2015-0107136

(51) Int. Cl.
| | |
|---|---|
| *H05K 5/00* | (2006.01) |
| *G02F 1/1333* | (2006.01) |
| *H05K 5/03* | (2006.01) |
| *G02F 1/1345* | (2006.01) |
| *H01L 27/32* | (2006.01) |

(52) U.S. Cl.
CPC ..... *H05K 5/0017* (2013.01); *G02F 1/133308* (2013.01); *H05K 5/03* (2013.01); *G02F 1/13452* (2013.01); *G02F 2001/133311* (2013.01); *G02F 2001/133314* (2013.01); *G02F 2001/133317* (2013.01); *H01L 27/3241* (2013.01)

(58) Field of Classification Search
CPC ..................................................... G02F 1/1333
USPC ..................................................... 361/679.21
See application file for complete search history.

(56) References Cited

U.S. PATENT DOCUMENTS 7,492,421 B1 * 2/2009 Kim .................. G02F 1/133308
349/58
2015/0168995 A1 6/2015 Jeon

FOREIGN PATENT DOCUMENTS

| JP | 2002-13953 A | 1/2002 |
| JP | 2015-11038 A | 1/2015 |

* cited by examiner

*Primary Examiner* — Jerry Wu
(74) *Attorney, Agent, or Firm* — Birch, Stewart, Kolasch & Birch, LLP

(57) ABSTRACT

There is provided a display device in which a drain hole is provided in incised portion of a middle cabinet supporting a display panel and a back cover, and thus plural circuit films and a printed circuit board and the like that are arranged in a circuit section coupled to the display panel can be protected by preventing inflow of moisture from the outside despite considerable reduction of a width of a front rim.

20 Claims, 6 Drawing Sheets

DISPLAY DEVICE

CROSS REFERENCE TO RELATED APPLICATION

This application claims priority from and the benefit under 35 U.S.C. §119(a) of Korean Patent Application No. 10-2015-0107136 filed on Jul. 29, 2015, which is hereby incorporated by reference for all purposes as if fully set forth herein.

BACKGROUND OF THE INVENTION

Field of the Invention

The present invention relates to a display device, and more particularly, to a narrow bezel type display device in which an area of an outer rim of the display device is reduced or a borderless type display device in which an outer rim is removed.

Description of the Related Art

In general, although a liquid crystal display device, a plasma display device, a field emission display device, a light emitting display device, and the like are actively studied as a flat type display device, the liquid crystal display device and the light emitting display device having merits of mass production technology, easiness of driving means, and realization of high resolution are in the spotlight.

FIG. 1 is a cross-sectional view illustrating a display device according to the related art. As illustrated in FIG. 1, the display device according to the related art includes a display panel 105, a printed circuit board 113 which is electrically connected to the display panel with plural circuit films 111 and is arranged in parallel with the rear side of the display panel 105, and a back cover 101 which safely holds the display panel 105 by wrapping a bending portion of the circuit films 111 from the end of the display panel 105.

The printed circuit board 113 is electrically connected to the plural circuit films 111 and supplies various signals for displaying an image on the display panel 105. A driving IC 117 for driving the display panel 105 and the like is embedded in the printed circuit board 113, a heat radiation pad 115 for radiating heat generated from the circuit films 111 and the printed circuit board 113 is coupled to the inner side of the back cover 101, and a heat radiation pad 119 for radiating heat by keeping a suitable space with the circuit films 111 is coupled to the lower part of the display panel 105.

However, in the display device according to the related art, though an area of a bezel exposed to the front can be reduced, there is a problem that moisture is introduced into between an end of the back cover and an end of the display panel and the moisture flows to the circuit films and the printed circuit board, and thus a short circuit occurs and an error is generated.

Particularly, when the short circuit and the error are generated, there is a problem that high cost and long repairing time are needed due to substitution of the whole display panel. Accordingly, in order to satisfy design requirements of a user, what is necessary is to develop a display device in which inflow of moisture from the outside can be prevented despite reduction of a width of an outer rim bezel.

SUMMARY OF THE INVENTION

From this background, an object of the present invention, in a display device having a small size or a large size, is to provide a display device in which decrease in thickness and decrease in weight can be contrived by considerably reducing a width of a front rim.

Another object of the present invention, in a display device having a small size or a large size, is to provide a display device in which plural circuit films and a printed circuit board and the like that are arranged in a circuit section coupled to the display panel can be protected by preventing inflow of moisture from the outside despite considerable reduction of a width of a front rim.

Further, objects of the present invention are not limited thereto, and still another object of the present invention that is not mentioned can be understood by those skilled in the art from the following description.

To accomplish the above-mentioned objects, there is provided a display device in which inflow of moisture from the outside can be prevented despite reduction of a width of a bezel of the display device by providing incisions in a middle cabinet and providing drain holes in a back cover, the middle cabinet and the back cover supporting the display panel.

As described above, according to the present invention, in a display device having a small size or a large size, decrease in thickness and decrease in weight can be contrived by considerably reducing a width of a front rim Further, according to the present invention, in a display device having a small size or a large size, plural circuit films and a printed circuit board and the like which are arranged in a circuit section coupled to the display panel can be protected and manufacturing process can be shortened by preventing inflow of moisture from the outside despite considerable reduction of a width of a front rim.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
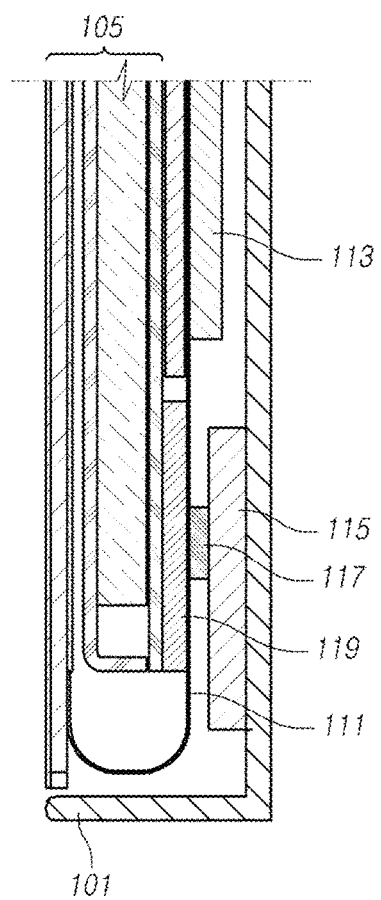
FIG. 1 is a cross-sectional view illustrating a display device according to the related art.

Hereinafter, some embodiments of the present invention will be described in detail with reference to the accompanying drawings. In describing the invention with reference to the accompanying drawings, like elements are referenced by like reference numerals or signs regardless of the drawing numbers. When it is determined that detailed description of known techniques involved in the invention makes the gist of the invention obscure, the detailed description thereof will not be made.

Terms such as first, second, A, B, (a), and (b) can be used to describe elements of the invention. These terms are merely used to distinguish one element from another element and the essence, order, sequence, number, or the like of the elements is not limited to the terms. If it is mentioned that an element is "coupled" or "connected" to another element, it should be understood that the element is directly coupled or connected to another element or still another element is "interposed" therebetween or the elements may be "coupled" or "connected" to each other with still another element interposed therebetween.

Figure 2:
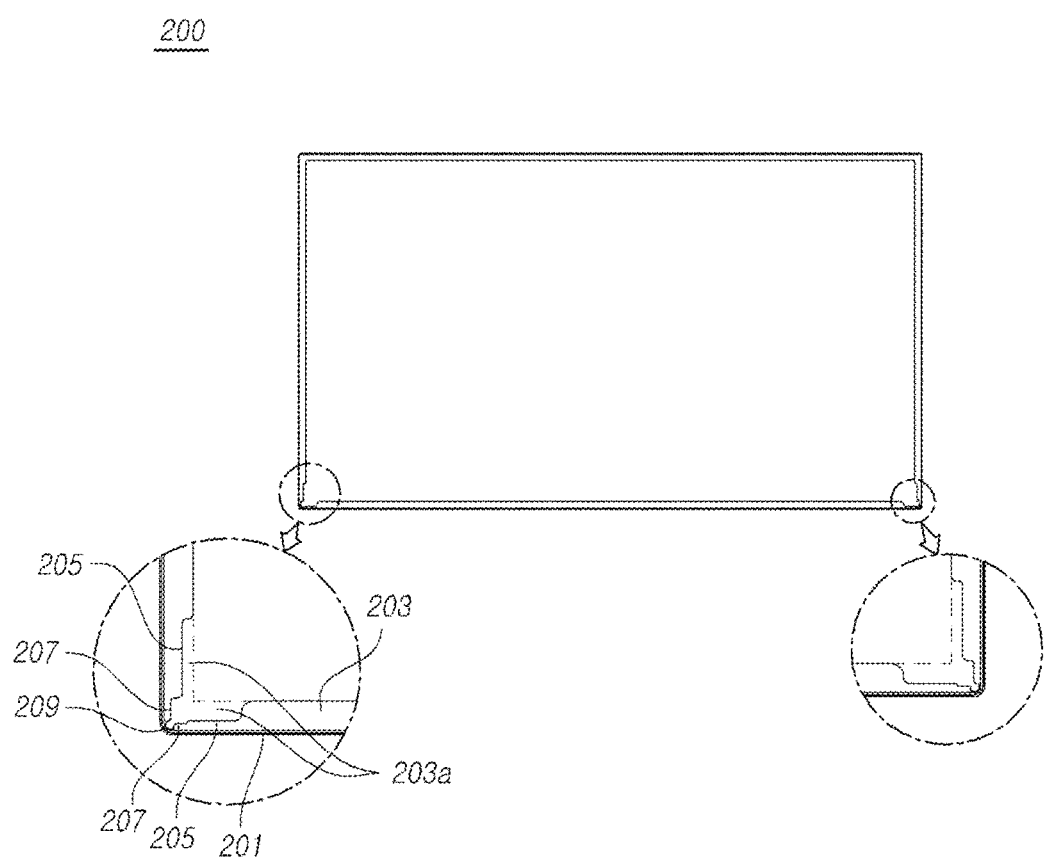
FIG. 2 is a front view illustrating a middle cabinet of a display device according to an embodiment of the present invention.
Figure 3:
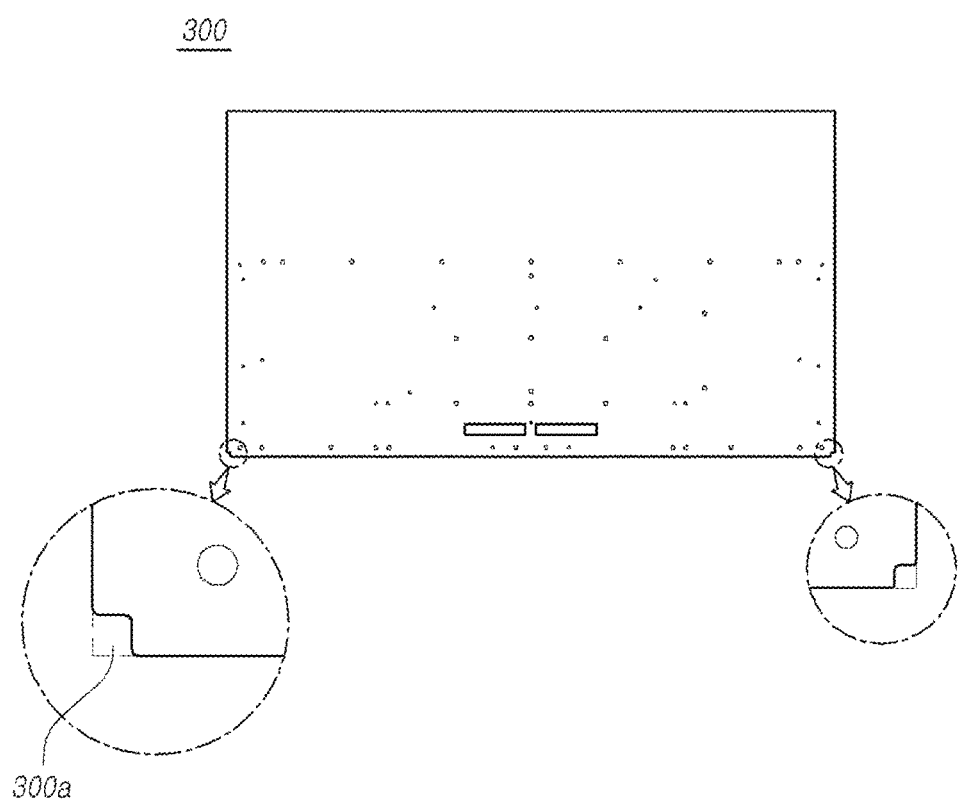
FIG. 3 is a front view illustrating a back cover of a display device according to the embodiment of the present invention.
Figure 4:
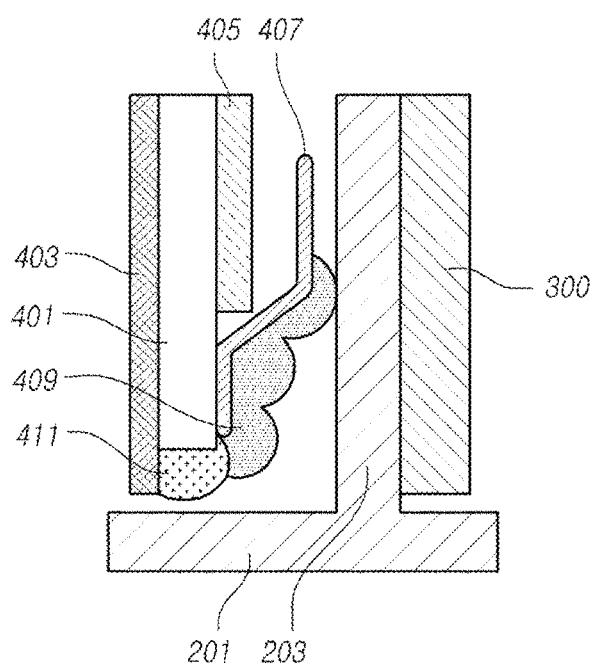
FIG. 4 is a cross-sectional view illustrating the display device according to the embodiment of the present invention.
Figure 5:
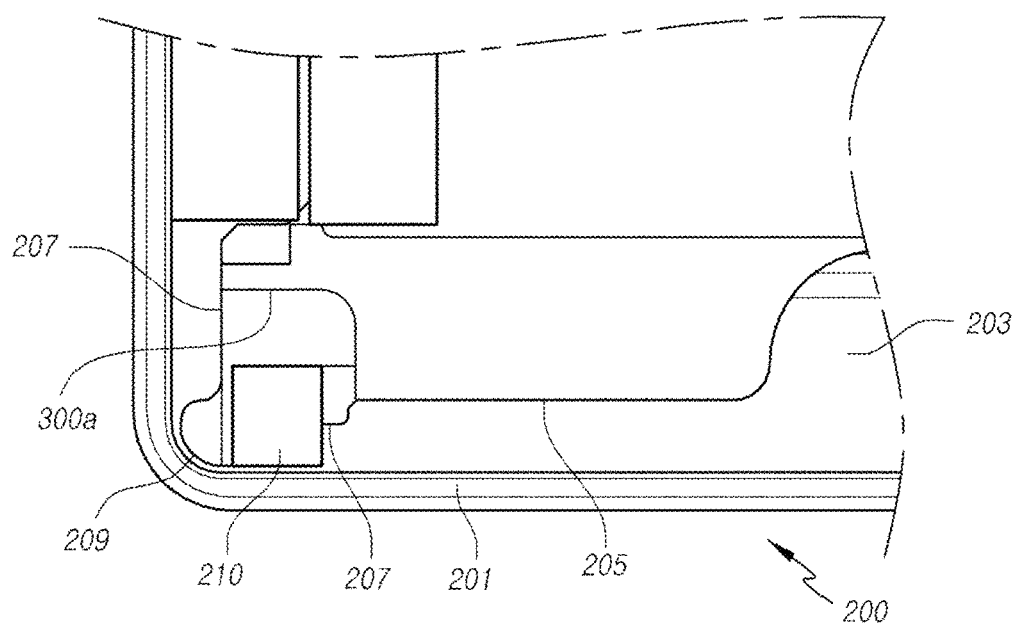
FIG. 5 is a front view illustrating the display device according to the embodiment of the present invention, a display panel not being embedded therein.
Figure 6:
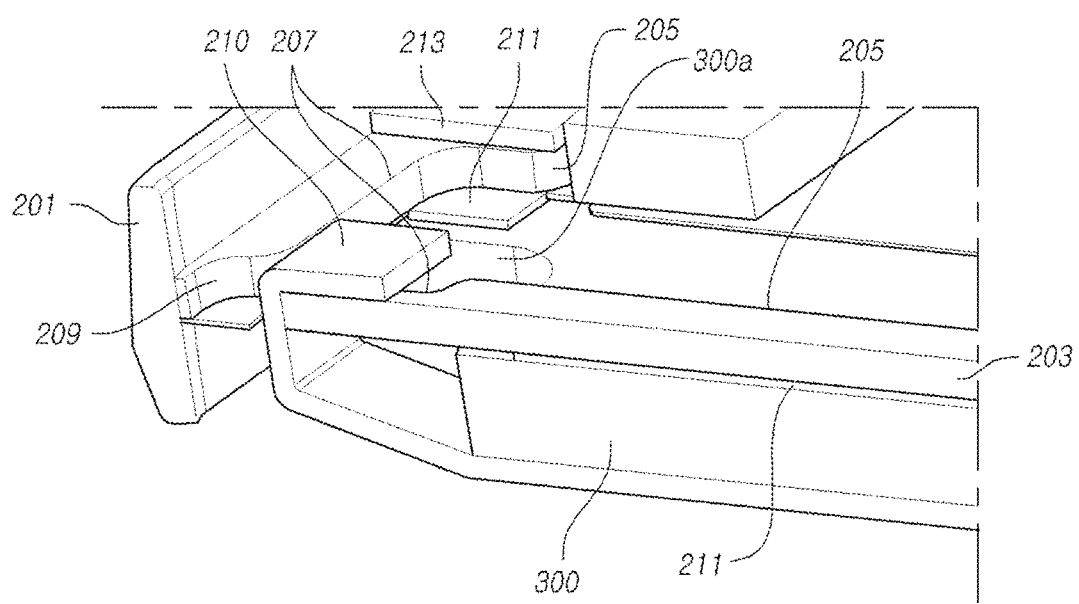
FIG. 6 is a perspective view taken by partially-cutting a portion of FIG. 5.

FIG. 2 is a front view illustrating a middle cabinet of a display device according to an embodiment of the present invention, FIG. 3 is a front view illustrating a back cover of a display device according to the embodiment of the present invention, FIG. 4 is a cross-sectional view illustrating the display device according to the embodiment of the present invention, FIG. 5 is a front view illustrating the display device according to the embodiment of the present invention, a display panel not being embedded therein, and FIG. 6 is a perspective view taken by partially-cutting a portion of FIG. 5.

As illustrated in the drawings, there is provided a display device according to an embodiment of the present invention, the display device including a display panel 401, a middle cabinet 200 that is constituted by a first supporting portion 201 which wraps a side of an end of the display panel 401 and a second supporting portion 203 which protrudes inside from an inner surface of the first supporting portion 201 and the display panel 401 is mounted on the second supporting portion 203 having one or two corner incisions; and a back cover 300 that is coupled to a rear surface of the second supporting portion 203 and has a drain hole 300a formed at one or both corners thereof to correspond to the one or two corner incisions of the middle cabinet.

First, in a display device according to the present invention, inflow of moisture can be prevented or introduced moisture can be discharged despite a four-surface borderless type or a bezeless type in which a width of an outer rim, that is, a bezel is considerably reduced.

As described above, the display panel 401 of the present invention may be a liquid crystal display panel or a light emitting display panel.

That is, when the display panel is configured by the liquid crystal display panel, a backlight unit for illuminating a light on the liquid crystal display panel, a bottom polarizing plate attached to a lower substrate, and a top polarizing plate attached to the front of a top substrate may be further included. Further, depending on a driving mode of the liquid crystal display panel such as a Twisted Nematic (TN) mode, a Vertical Alignment (VA) mode, an In Plane Switching (IPS) mode, a Fringe Field Switching (FFS) mode, specific configurations of the bottom substrate and the top substrate are formed in various types known to the related art.

Further, when the display panel is configured by the light emitting display panel, the light emitting display panel is configured by including a bottom substrate which includes plural light emitting cells, each cell being formed in an every area defined by a gate line, a data line, and a power (VDD) line, and a top substrate which is combined with the bottom substrate to face thereto.

Accordingly, each of the plural light emitting cells formed in the bottom substrate is configured by including at least one switching transistor coupled to the gate line and the data line, at least one driving transistor coupled to the switching transistor and the power (VDD) line, and a light emitting device (for example, an OLED) emitting light depending on current controlled by switching of the driving transistor, and the top substrate is configured to include a hygroscopic agent for protecting a light emitting device from moisture or oxygen in the air.

Here, a light emitting device coupled to the driving transistor may be further included in the top substrate, and in this case, a light emitting device of the bottom substrate may be omitted.

As described above, the middle cabinet 200 supporting the display panel 401 of the present invention includes the first supporting portion 201 which wraps a side of an end of the display panel 401 and the second supporting portion 203 which protrudes inside from the inner side surface of the first supporting portion 201 and the display panel 401 is mounted on.

The display panel 401 is mounted on the upper part of the second supporting portion 203 of the middle cabinet 200. Though the light emitting display panel is illustrated as an example in drawings, a backlight unit illuminating light to the panel is not configured due to configuration of illumination light by itself. Hereinafter, an explanation is made with reference to FIG. 4 illustrating the light emitting display panel.

As organic compound in a pixel array of the display panel 401 may be deteriorated when exposed to moisture or oxygen, in order to protect such deterioration, encapsulation member 405 may adhere to the rear surface of the display panel 401 to seal the pixel array.

Here, the encapsulation member 405 may be a metal plate or a glass plate, and a polarizing film 403 may adhere to the entire surface of the display panel 401.

Further, in order to prevent light leakage caused by light emitted through sides from the pixel array, side seal member 411 may be provided in the sides of the display panel 401.

Here, the side seal member 411 is formed by polymer materials in which black pigment is added, and the side seal member 411 absorbs light emitted from the pixel array, and thus light emitted through the sides of the display panel 401 cannot be seen.

And, plural flexible circuit films 407 in which an IC is mounted are electrically connected to the display panel 401 in the rear surface of a bottom end of the display panel 401 having a rectangular shape, and a printed circuit board is provided in parallel with the display panel 401.

And, the plural flexible circuit films 407 are attached to a pad portion and the printed circuit board by using a TAB (Tape Automated Bonding) process, and may be configured by a TCP (Tape Carrier Package) or a COF (Chip On Flexible board or Chip On Film).

Accordingly, the display panel 401 is electrically coupled or connected to the printed circuit board (not shown) via the plural flexible circuit films 407, and the printed circuit board is electrically coupled to the plural flexible circuit films 407 to provide various signals for displaying an image to the display panel 401.

The middle cabinet 200 is configured by a first supporting portion 201 and a second supporting portion 203 that are perpendicular to each other. Here, the first supporting portion 201 wraps the side of the end of the display panel 401 and is exposed to the front. And, the display panel 401 is mounted on the front surface of the second supporting portion 203, and the back cover 300 is coupled to the rear surface of the second supporting portion 203.

As described above, when the end of the first supporting portion 201 becomes the bezel, the width of the bezel is considerably decreased, but there is the possibility that moisture may be introduced between the first supporting portion and the end of the panel 401. However, since a side or both sides corners of the middle cabinet 200 are incised and a drain hole 300a is formed in a side or both sides corners of the back cover 300, the flexible circuit film 407 and the printed circuit film is configured to be protected from the moisture inflow.

For example, as illustrated in FIG. 4, a moisture-proof and insulation member 409 (also known as a Tuffy) for protecting an IC and circuit elements of the flexible circuit film 407 is provided in a side surface and a rear surface of the flexible circuit film 407. Therefore, when moisture is introduced between the first supporting portion 201 and the end of the panel 401 and the moisture introduced from the outside is accumulated to be an amount, the moisture moves to the both sides due to a capillary phenomenon of a small space (about 0.6 to 0.8 mm) among the first supporting portion 201, the display panel 401, the moisture-proof and insulation member 409, the second supporting portion 203, and the like.

Since a corner in which a bottom part of the second supporting portion 203 is coupled to a side part of the second supporting portion 203 is incised in the middle cabinet 200, the moisture which moves to both bottom corners does not move to the flexible circuit film 407 and the printed circuit film and is drained to the outside via the incision portion 203a.

Further, as a first step portion 205 is formed in the middle cabinet 200 by incising an inner end of the second supporting portion 203 in the direction of the first supporting portion 201, the moisture moves to both bottom corner portions via a space between the moisture-proof and insulation member 409 and the second supporting portion 203. Then, the moisture does not move to the flexible circuit film 407 and the printed circuit film and flows into the first step portion 205.

A second step portion 207 is also formed in the middle cabinet 200 by further incising an inner end of the first step portion 205 in the direction of the first supporting portion 201 to be closer to the corner than the first step portion 205. Since the second step portion 207 is formed to correspond to the drain hole 300a of the back cover 300, moisture which flowed to the first step portion 205 is drained to the drain hole 300a via the second step portion 207.

Since an incision hole 209 is further formed in a corner area to which the second step portion 207 of the side of the second supporting portion 203 and the second step portion 207 of the bottom of the second supporting portion 203 are coupled to expose the inner surface of the first supporting portion 201 and an absorption member 210 is combined between the top side surface of the second step portion 207 and the bottom side surface of the display panel 401, moisture which flowed downward from the second step portion 207 of the side of the second supporting portion 203 is not introduced into the bottom of second supporting portion 203 but drained to the drain hole 300a.

Further, the absorption member 210 is curved with wrapping the second step portion 207 and is combined to wrap the rear surface of the back cover 300, and thus the absorption member 210 absorbs the moisture which is gathered into the second step portion 207 of the side of the second supporting portion 203 and the second step portion 207 of the bottom of the second supporting portion 203. As a result, the moisture does not flow up to the flexible circuit film 407 and the printed circuit, and is drained to the outside of the back cover 300.

Therefore, though a user spray liquid such as cleaning agent on the display panel 401, moisture moves to both sides via the second supporting portion 203 of the middle cabinet 200 and is drained to the outside through the drain hole 300a. As a result, the moisture cannot be introduced into the flexible circuit film 407, so that the IC and the circuit elements weak in the moisture can be protected.

The middle cabinet 200 and the back cover 300 are bonded by using an adhesive member 211 such as an adhesive pad or a double-sided tape, and may be bonded with the display panel 401 via the adhesive member 211 such as the adhesive pad or the double-sided tape provided in the upper part of the second supporting portion 203.

Further, although moisture is introduced into the other ends of four ends of the display panel 401, the flexible circuit film 407 is not provided in the other ends, so that there is no influence on the flexible circuit film 407. Therefore, an adhesive pad, a double-sided tape, or the like may be combined instead of the absorption member 210.

Accordingly, in order to well discharge heat radiated from the display panel 401 to the middle cabinet 200, the adhesive pad or the double-sided tape may use an adhesive thermal conductive tape.

Considering a molding property, a cost, and the like, this middle cabinet 200 is formed by using synthetic resins such as plastics or metallic materials. However, considering a reasonable intensity and heat dissipation property, the middle cabinet 220 is formed by using aluminum, aluminum alloy, stainless, stainless steel, zinc galvanizing steel plate, or the like.

As described above, according to the embodiments of the present invention, in a display device having a small size or a large size, decrease in thickness and decrease in weight can be contrived by considerably reducing a width of a front rim.

Further, according to the embodiments of the present invention, in a display device having a small size or a large size, plural circuit films and a printed circuit board and the like that are arranged in a circuit section coupled to the display panel can be protected by preventing inflow of moisture from the outside despite considerable reduction of a width of a front rim.

Though all elements constituting the embodiments of the present invention are explained to be combined or operated as one, the present invention is not limited thereto. That is, within the scope of the object of the present invention, the all elements may be operated to be selectively combined as one or more.

Further, the terms, such as "include", "constitute", or "have" described herein means that corresponding component is inherent so long as there is no special description of opposite meaning, and thus should be construed as not excluding another component but further including another component. All terms including technical terms and scientific terms should be understood to have the same meaning as what is generally construed by those skilled in the art so long as it is differently defined. General term such as terms defined in a dictionary should be construed to be equal to the meaning of a context of the related art, and should not construed as ideal or excessive formal meaning so long as it is not clearly defined in the present invention.

Foregoing embodiments disclosed herein shall be interpreted as only illustrative of the technical spirit of the present invention, and, those skilled in the art can understand that various variations and modifications can be implemented without departing from essential features of the present invention. Accordingly, it should be understood that embodiments disclosed in the present invention are not definitive but explanatory and the technical concepts of the present invention is not limited to the embodiments. The protective scope of the present invention is defined by the appended claims, and all the technical ideas within a range equivalent thereto should be construed as belonging to the scope of the present invention.

What is claimed is:

1. A display device comprising: a display panel; a middle cabinet including a first supporting portion and a second supporting portion that are substantially perpendicular to each other, wherein the second supporting portion protrudes from the first supporting portion and is configured to support the display panel by a front surface of the second supporting portion, the second supporting portion having one or two corner incisions; and a back cover that is directly coupled to a rear surface of the second supporting portion and has at least one drain hole, to drain moisture, formed at a bottom left corner or bottom right corner of the back cover to correspond to the one or two corner incisions of the middle cabinet.

2. The display device according to claim 1, wherein a bottom left or bottom right corner of the middle cabinet in which a bottom part of the second supporting portion is coupled to a side part of the second supporting portion is incised in the middle cabinet.

3. The display device according to claim 2, wherein the middle cabinet has a first step portion that is formed by incising an inner end of the second supporting portion in a direction of the first supporting portion.

4. The display device according to claim 3, wherein the middle cabinet further has a second step portion that is formed by further incising an end of the first step portion in the direction of the first supporting portion and is closer to the bottom left or bottom right corner compared to the first step portion.

5. The display device according to claim 4, wherein the second step portion corresponds to the at least one drain hole of the back cover.

6. The display device according to claim 4, wherein the middle cabinet has an incision hole that is formed by further incising a bottom left or bottom right corner portion in which a bottom portion of the second step portion of the second supporting portion is coupled to a side portion of the second step portion of the second supporting portion to expose an inner surface of the first supporting portion.

7. The display device according to claim 6, further comprising an absorption member provided between a top side surface of the second step portion and a bottom side surface of the display panel.

8. The display device according to claim 7, wherein the absorption member is curved with wrapping the second step portion and is provided to wrap a rear surface of the back cover via the incision hole of the middle cabinet.

9. A display device comprising: a display panel; a middle cabinet including: a first supporting portion wrapping a side of an end of the display panel; and a second supporting portion comprising a front surface on which the display panel is mounted, the second supporting portion protruding inside from an inner surface of the first supporting portion and including one or two corner incisions; and a back cover directly coupled to a rear surface of the second supporting portion, and including at least one drain hole, to drain moisture, formed at a bottom left corner or bottom right corner of the back cover to correspond to the one or two corner incisions of the middle cabinet.

10. The display device of claim 9, wherein the second supporting portion includes a first step portion that is formed by incising an inner end of the second supporting portion in a direction of the first supporting portion.

11. The display device of claim 10, wherein the second supporting portion further includes a second step portion that is formed by further incising an end of the first step portion in the direction of the first supporting portion and is closer to the bottom left or bottom right corner compared to the first step portion.

12. The display device of claim 11, wherein the second step portion corresponds to the at least one drain hole of the back cover.

13. The display device of claim 11, wherein the middle cabinet further includes an incision hole that is formed by further incising a bottom left or bottom right corner portion in which a bottom portion of the second step portion is coupled to a side portion of the second step portion to expose an inner surface of the first supporting portion.

14. The display device of claim 11 further comprising an absorption member provided between a top side surface of the second step portion and a bottom side surface of the display panel.

15. The display device of claim 14, wherein the absorption member is provided to wrap a rear surface of the back cover via the incision hole of the middle cabinet.

16. A narrow bezel display device comprising: a display panel; a middle cabinet including a first supporting portion and a second supporting portion configured to support the display panel by a front surface of the second supporting portion, the second supporting portion protruding from the first supporting portion and having at least one corner incision; and a back cover directly coupled to a rear surface of the second supporting portion, the back cover including at least one drain hole, wherein the middle cabinet further includes an incision hole at a bottom left corner or bottom right corner of the middle cabinet to drain moisture to the at least one drain hole of the back cover.

17. The narrow bezel display device according to claim 16, wherein the bottom left or bottom right corner of the middle cabinet in which a bottom part of the second supporting portion is coupled to a side part of the second supporting portion is incised in the middle cabinet.

18. The narrow bezel display device according to claim 17, wherein the middle cabinet has a first step portion that is formed by incising an inner end of the second supporting portion in a direction of the first supporting portion.

19. The narrow bezel display device according to claim 18, wherein the middle cabinet further has a second step portion that is formed by further incising an end of the first step portion in the direction of the first supporting portion and is closer to the bottom left or bottom right corner compared to the first step portion.

20. The narrow bezel display device according to claim 19, wherein the second step portion corresponds to the at least one drain hole of the back cover.

* * * * *